United States Patent [19]

Ahmed

[11] 4,216,435
[45] Aug. 5, 1980

[54] VOLTAGE-TO-CURRENT CONVERTER APPARATUS

[75] Inventor: Adel A. A. Ahmed, Clinton Township, Hunterdon County, N.J.

[73] Assignee: RCA Corporation, New York, N.Y.

[21] Appl. No.: 6,877

[22] Filed: Jan. 25, 1979

[51] Int. Cl.[2] ............................ H03F 3/45; H03F 3/04
[52] U.S. Cl. ..................................... 330/254; 330/259; 330/278; 330/301; 330/257
[58] Field of Search ............... 330/254, 257, 259, 277, 330/278, 288, 290, 300, 301

[56] References Cited

U.S. PATENT DOCUMENTS

| | | | |
|---|---|---|---|
| 3,710,270 | 1/1973 | Addis et al. ..................... | 330/284 X |
| 4,004,247 | 1/1977 | Van de Plassche ................ | 323/4 X |

*Primary Examiner*—James B. Mullins
*Attorney, Agent, or Firm*—E. M. Whitacre; P. J. Rasmussen; A. L. Limberg

[57] ABSTRACT

The voltage-to-current converter includes first and second transistors having their respective common electrodes arranged to receive between them the voltage to be converted to current. Their output electrodes have connections to first and second current supply means, as well as direct coupled feedback connections to their respective input electrodes. At least one of these feedback connections is via the follower action of a respective further transistor between its input and common electrodes, and converted output current is available at the output electrode of each further transistor. First and second resistances connect the common electrodes of said first and second transistors to a node supplied quiescent current by a third current supply means, and their combined resistance controls the voltage-to-current conversion gain.

9 Claims, 4 Drawing Figures

VOLTAGE-TO-CURRENT CONVERTER APPARATUS

The present invention relates to linear voltage-to-current converters.

It is often desirable to convert voltages to currents in transistor circuitry without incurring non-linearities associated with the modulation of the emitter-base voltage of a transistor with changes in the levels of the currents it conducts.

The present invention is embodied, for example, in a voltage-to-current converter of the following type. First and second resistive means have respective first ends respectively connected to the respective input electrodes of first and second transistors of a first conductivity type, the respective output electrodes of which transistors have first and second current supply means respectively connected to them, and the respective common electrodes of which transistors connect to respective ones of non-inverting and inverting input signal terminals IN and $\overline{\text{IN}}$. Voltage to be converted to current may be applied in balanced form or other differential form between these terminals. Or voltage to be converted to current can be applied to one of these terminals with other receiving a reference potential. A third current supply means connects to an interconnection of the second ends of the first and second resistive means. Each of the first and second transistors is provided with a respective direct coupled feedback connection from its output electrode to its input electrode, the latter feedback connection including a third transistor of the first conductivity type. More particularly, the third transistor has an input electrode to which the output electrode of the second transistor connects, has a common electrode connected to the input electrode of the second transistor, and has an output electrode connected to a terminal OUT from which the current obtained from voltage-to-current conversion is made available.

Figure 1:
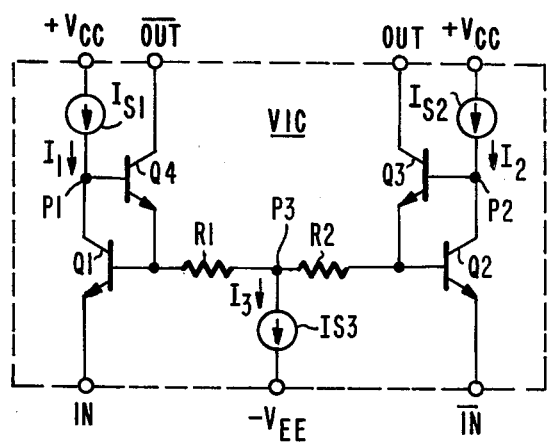
FIG. 1 is a schematic diagram of a voltage-to-current converter embodying the present invention.

The voltage-to-current converter VIC of FIG. 1 receives input voltage that is the difference between (a) the potential applied via terminal IN to the emitter electrode of an NPN bipolar transistor Q1 and (b) the potential applied via terminal $\overline{\text{IN}}$ to the emitter electrode of an NPN bipolar transistor Q2. Q1 is provided with a direct-coupled collector-to-base feedback connection for adjusting its emitter-to-base voltage $V_{BEQ1}$ to such value that it will conduct, via its collector-to-emitter path, substantially all of the current $I_1$ supplied by a current supply or source IS1 to a point P1 to which the collector electrode of Q1 connects. The small remainder flows as an error current to the base electrode of an NPN bipolar transistor Q4, the emitter-follower action of which is used in the collector-to-base feedback connection of Q1. Similarly, Q2 is provided with a direct-coupled collector-to-base feedback connection via the emitter-follower action of NPN bipolar transistor Q3 for adjusting the emitter-to-base voltage $V_{BEQ2}$ to such value that Q2 will conduct, via its collector-to-emitter path, substantially all of the current $I_2$ supplied by a current supply or source IS2 to a point P2 to which the collector electrode of Q2 connects.

$V_{BEQ1}$ will approximate $V_{BEQ2}$, whatever the values of $I_1$ and $I_2$, inasmuch as the emitter-to-base voltage of a transistor is logarithmically related to its collector current. However, supposing Q1 and Q2 to be monolithically integrated transistors with similar doping profiles, preferably $I_1$ is related to $I_2$ in the same ratio as the effective emitter area of Q1 is related to the effective emitter area of Q2, so $V_{BEQ1}$ and $V_{BEQ2}$ are equal to a common $V_{BE}$ value. The base potentials of Q1 and Q2 will then be more positive by this $V_{BE}$ value respectively than the potentials $V_{IN}$ and $V_{\overline{IN}}$ applied at terminals IN and $\overline{\text{IN}}$ respectively, and the difference between the base potentials of Q1 and Q2 will be equal to the difference between $V_{IN}$ and $V_{\overline{IN}}$. This equality obtains despite variation of $V_{BEQ1}$ and $V_{BEQ2}$ due to change in the operating temperature of Q1 and Q2 or to process variation in their manufacture, inasmuch as $V_{BEQ1}$ and $V_{BEQ2}$ change similarly, assuming VIC to be constructed in a monolithic integrated circuit per usual practice.

The collector electrodes of Q3 and Q4 connect to terminal OUT and to terminal $\overline{\text{OUT}}$, respectively, of the voltage-to-current converter VIC. Owing to its common base amplifier action, Q3 demands a collector current $I_{CQ3}$ at terminal OUT, the amplitude of which is equal to $\alpha_{Q3}$ times the amplitude of its emitter current $I_{EQ3}$, $\alpha_{Q3}$ being the common-base forward current gain of Q3, which approaches $-1$ within a percent or so in most modern transistors. Similarly, owing to its common-base amplifier action, Q4 demands a collector current $I_{CQ4}$ at terminal $\overline{\text{OUT}}$, the amplitude of which is equal to $\alpha_{Q4}$ times its emitter current $I_{EQ4}$, $\alpha_{Q4}$ being the common-base forward current gain of Q4 and being substantially the same in value as $\alpha_{Q3}$.

Resistive elements R1 and R2 connect the emitter electrodes of Q3 and Q4, respectively, to a point P3 from which a current supply or sink IS3 withdraws a current $I_3$. R1 and R2 have respective resistances $R_1$ and $R_2$. The currents flowing through R1 and R2 can be most readily determined using the superposition principle. That is, the currents in each circuit element attributable to each current source when one replaces the other current sources by open circuits and voltage sources by short circuits are determined. Then the currents in each circuit element attributable to each voltage source when one replaces the other voltage sources by short circuits and current sources by open circuits are determined. The currents thus determined in each element, when summed, equal the current flowing in that element when all sources are restored.

As a first step in applying the superposition principle the current sources IS1, IS2 and IS3 are replaced by respective open circuits. The voltage source applying a difference potential $(V_{IN} - V_{\overline{IN}})$ between terminals $\overline{\text{IN}}$ and IN will cause a like-valued difference potential between the emitter electrodes of Q3 and Q4 as has been described supra—that is, across the series connection of R1 and R2 in the circuit modified for analysis. By Ohm's Law a current component equal to $(V_{IN} - V_{\overline{IN}})/(R_1 + R_2)$ must flow through R1 and R2 responsive to the difference between $V_{\overline{IN}}$ and $V_{IN}$. So the component of $I_{EQ3}$ attributable to this difference is $-(V_{IN}-V_{\overline{IN}})/(R_1+R_2)$, and the component of $I_{EQ4}$ attributable to this difference is $(V_{IN}-V_{\overline{IN}})/(R_1+R_2)$.

As a second step in applying the superposition principle, the voltage source that would appear between terminals IN and $\overline{IN}$ is replaced by short circuit, which sets $V_{IN}$ equal to $V_{\overline{IN}}$ and current sources IS1 and IS2 are replaced by open circuits. Setting $V_{IN}$ equal to $V_{\overline{IN}}$ makes the base potentials of Q1 and Q2 equal, so the respective emitter potentials $V_{EQ3}$ and $V_{EQ4}$ of Q3 and Q4 are equal. The current $-I_3$ applied to P3 divides between R1 and R2 in proportion to their respective conductances $1/R_1$ and $1/R_2$. So, $I_{EQ4}$ has a component $I_3R_2/(R_1+R_2)$ attributable to the division of $I_3$; and $I_{EQ3}$ has a component $I_3R_1/(R_1+R_2)$ attributable to the division of $I_3$.

As a third step in applying the superposition principle IS3 is replaced by open circuit and terminals IN and $\overline{IN}$ are connected by short circuit. Since the circuit maintains $V_{EQ3}$ equal to $V_{EQ4}$ when $V_{\overline{IN}}$ and $V_{IN}$ are equal, there is no current flow through the series connection of R1 and R2. Thus, one may replace this series connection by open circuit for purposes of continuing analysis. IS1 and IS2 do not interact, and they may be simultaneously rather than serially applied to determine current components in the circuit elements. $I_1$ will equal the base current $I_{BQ3}$ of Q3 plus the collector current $I_{CQ1}$ of Q1. $I_{CQ1}$ equals its base current $I_{BQ1}$ times its common-emitter forward current gain $\beta_{Q1}$. IBQ1 equals $I_{EQ4}$ when R1 and R2 are non-conductive or replaced by open-circuit for analysis. $I_{EQ4}$ equals the base current $I_{BQ4}$ of Q4 times $(\beta_{Q4}+1)$, where $\beta_{Q4}$ is the common-emitter forward current gain of Q4. These observations permit one to determine the relationship between $I_1$ and $I_{EQ4}$ by the following steps.

$$
\begin{aligned}
I_1 &= I_{BQ4} + I_{CQ1} \\
&= I_{BQ4} + I_{BQ1}\beta_{Q1} \\
&= I_{BQ4} + I_{EQ4}\beta_{Q1} \\
&= I_{EQ4}/(\beta_{Q4}+1) + I_{EQ4}\beta_{Q1} \\
&= I_{EQ4}[1/(\beta_{Q4}+1) + \beta_{Q1}] \\
&= I_{EQ4}[(\beta_{Q1}\beta_{Q4}+\beta_{Q1}+1)/(\beta_{Q4}+1)]
\end{aligned}
$$

One may then express $I_{EQ4}$ in the circuit modified for analysis per the third step of applying the superposition principle as follows.

$$I_{EQ4}=I_1[(\beta_{Q4}+1)/(\beta_{Q1}\beta_{Q4}+\beta_{Q1}+1)] \text{ for } I_3=0, V_{IN}=V_{\overline{IN}}.$$

One may similarly derive the following expression for $I_{EQ3}$ in the circuit modified for analysis per the third step of applying the superposition principle.

$$I_{EQ3}=I_2[(\beta_{Q3}+1)/(\beta_{Q2}\beta_{Q3}+\beta_{Q2}+1)] \text{ for } I_3=0, V_{IN}=V_{\overline{IN}}.$$

The total $I_{EQ3}$ flowing in the restored circuit will then be as immediately follows.

$$I_{EQ3}=-[(V_{IN}-V_{\overline{IN}})/(R_1+R_2)]+[I_3R_1/(R_1+R_2)]+[I_2(\beta_{Q3}+1)/(\beta_{Q2}\beta_{Q3}+\beta_{Q2}+1)].$$

The total $I_{EQ4}$ flowing in the restored circuit will be as immediately follows.

$$I_{EQ4}=[(V_{IN}-V_{\overline{IN}})/(R_1+R_2)]+[I_3R_2/(R_1+R_2)]+[I_1(\beta_{Q4}+1)/(\beta_{Q1}\beta_{Q4}\beta_{Q1}+1)].$$

One obtains the following values for $I_{CQ3}$ and $I_{CQ4}$.

$$I_{CQ3}=\alpha_{Q3}\{-[(V_{IN}-V_{\overline{IN}})/(R_1+R_2)]+[I_3R_1/(R_1+R_2)]+[I_2(\beta_{Q3}+1)/(\beta_{Q2}\beta_{Q3}+\beta_{Q2}+1)]\}$$

$$I_{CQ4}=\alpha_{Q4}\{[(V_{IN}-V_{\overline{IN}})/(R_1+R_2)]+[I_3R_2/(R_1+R_2)]+[I_1(\beta_{Q4}+1)/(\beta_{Q1}\beta_{Q4}+\beta_{Q1}+1)]\}.$$

It will be observed that these output currents each comprise a direct component plus a signal component of an amplitude substantially equal to $(V_{IN}-V_{\overline{IN}})/(R_1+R_2)$.

In practice it is often convenient to subtract $I_{CQ3}$ from $I_{CQ4}$, so that their opposite polarity signal components combine to augment each other and their like polarity direct components combine to reduce each other.

Figure 2:
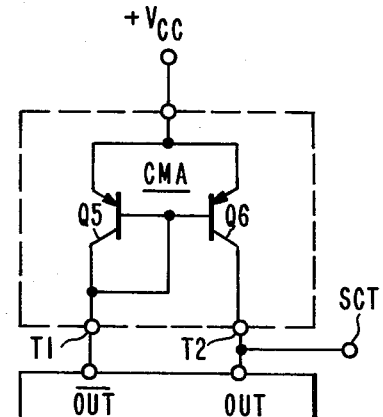
FIGS. 2 and 3 are schematic diagrams of more complex voltage-to-current converters, which are alternative embodiments of the present invention and include the structure shown in FIG. 1.
Figure 3:
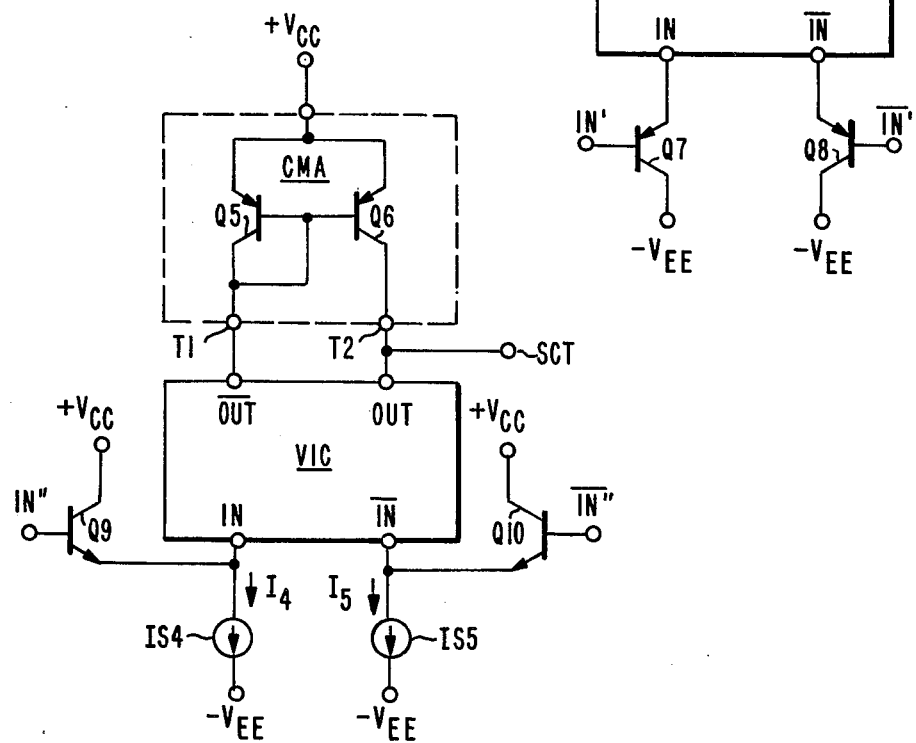

In FIGS. 2 and 3 a current mirror amplifier CMA is used for this purpose, its input terminal T1 having the terminal $\overline{OUT}$ of the voltage-to-current converter VIC connected to it, its output terminal T2 being connected to the terminal OUT of the converter VIC and to a signal current terminal SCT, and its common terminal T3 being connected to receive a positive operating potential $+V_{CC}$. As used in this specification, the term current mirror amplifier refers to a linear inverting current amplifier of the kind comprising current-to-voltage converter means responsive to the amplifier input current for producing a voltage and a voltage-to-current converter means responsive to said voltage for producing the amplifier output current, wherein each converter means exhibits a respective current/voltage characteristic, which may be non-linear, those characteristics being related by a factor G independent of the magnitude of the current being amplified and being selected to track each other with changes in temperature. This provides an overall amplifier gain wherein the ratio of output current to input current magnitudes equals the factor G over substantial ranges of both temperature and the magnitude of the amplified current. While a current mirror amplifier may take a variety of forms, that of CMA, shown in FIGS. 2 and 3, is a simple, often-found one. PNP bipolar transistor Q5 is provided with direct-coupled collector-to-base feedback to adjust its emitter-to-base voltage $V_{BEQ5}$ for conditioning it to conduct substantially all the current withdrawn from terminal T2, thus acting as the current-to-voltage converter means of the current mirror amplifier CMA. PNP bipolar transistor Q6 acts as the voltage-to-current converter means responding to $V_{BEQ5}$ applied as its emitter-to-base voltage $V_{BEQ6}$ to supply a collector current at terminal T2 proportionally related to that withdrawn from terminal T1. By making $G=(R_1/R_2)=(I_1/I_2)$, assuming $\beta_{Q1}=\beta_{Q2}$ and $\beta_{Q3}=\beta_{Q4}$, the current supplied from terminal SCT will have a value $(G+1)\alpha[(V_{IN}-V_{\overline{IN}})/(R_1+R_2)]$ where $\alpha$ is the value of both $\alpha_{Q3}$ and $\alpha_{Q4}$. For modern transistors $\alpha$ usually approaches minus unity within 3% or less. Values still closer to unity can be obtained by using respective Darlington cascade connections in place of Q3 and Q4 or by replacing NPN bipolar transistors Q3 and Q4 with n-channel field effect transistors. In symmetrical circuits where ideally $G=(R_1/R_2)=(I_1/I_2)=1$ the voltage-to-current conversion gain of configurations combining VIC and CMA, as exemplified by FIGS. 2 and 3 will closely approach $2(V_{IN}-V_{\overline{IN}})/(R_1+R_2)$.

The fact that Q1 and Q2 conduct currents through their respective collector-to-emitter paths that substantially equal $I_1$ and $I_2$, respectively, can be used to advantage in designing buffer amplification to precede terminals IN and $\overline{\text{IN}}$. The input voltages applied to terminals IN and $\overline{\text{IN}}$ of voltage-to-current converter VIC work into an input impedance substantially equal to $(\beta_{NPN}+1)(R_1+R_2)$, where $\beta_{NPN}$ is the common-emitter forward current gain of NPN transistors Q3 and Q4. This comes about as follows. The changes in voltage between terminals IN and IN' are applied with similar voltage translation at the base electrodes of Q1 and Q2 to cause current flow through the series connection of R1 and R2, which current flow directly affects the emitter currents of Q3 and Q4. The base currents of Q3 and Q4 are affected in $\beta_{NPN}$:1 proportion as their respective emitter currents which incremental changes to $I_1$ and $I_2$ appear at terminals IN and IN'. However, it is sometimes desired to have a voltage-to-current converter with still higher input impedance for applied input voltage.

In FIG. 2 emitter-follower PNP transistors Q7 and Q8 provide input impedance $(\beta_{PNP}+1)$ times $(\beta_{NPN}+1)$ times $(R_1+R_2)$ between auxiliary input signal voltage terminals IN' and $\overline{\text{IN}}$ at their respective base electrodes, assuming Q7 and Q8 to have similar common-emitter forward current gains of $\beta_{PNP}$. The emitters of Q7 and Q8 connect to the terminals IN and $\overline{\text{IN}}$, respectively, of the voltage-to-current converter VIC to receive currents substantially equal to $I_1$ and $I_2$, respectively. Correct physical dimensioning of Q7 and Q8 will then cause their respective emitter-to-base offset voltages $V_{BEQ7}$ and $V_{BEQ8}$ to be equal, owing to the tracking between $I_1$ and $I_2$. Similarly, Q7 and Q8 may be replaced by p-channel field effect transistors, respectively, in respective source-follower configurations for providing still higher input impedance between terminals IN' and $\overline{\text{IN}}$ (e.g., about $10^{12}$ ohms).

FIG. 3 shows how one may accommodate use of follower transistors of a complementary conductivity type to that of Q7 and Q8. NPN bipolar transistors Q9 and Q10 are connected as emitter-follower transistor amplifiers with auxiliary input signal voltage terminals IN" and $\overline{\text{IN}}$" at their respective base electrodes. The emitter of Q9 is connected to the terminal IN, to which a current supply IS4 is also connected as a current sink. IS4 demands a current $I_4$ larger than the current substantially equal to $I_1$ available at terminal IN from the emitter of Q1, so the emitter of Q9 is called upon to supply a current substantially equal to $(I_4-I_1)$. The emitter of Q10 is connected to terminal $\overline{\text{IN}}$, to which a current supply IS5 is also connected as a current sink. IS5 demands a current $I_5$ larger than the current substantially equal to $I_2$ available at terminal $\overline{\text{IN}}$ from the emitter of Q2, so the emitter of Q10 is called upon to supply a current substantially equal to $(I_5-I_2)$. By proportioning $I_4$ and $I_5$ to $I_1$ and $I_2$, respectively, and selecting the physical dimensions of Q9 and Q10 correctly, the base-emitter offset voltages of Q9 and Q10 will match. Emitter-follower transistors Q9 and Q10 may be replaced by respective n-channel source-follower field effect transistors, of course.

An advantageous feature of voltage-to-current converters of the types described supra is that the current $I_3$ may be chosen independently of currents $I_1$ and $I_2$ (and currents $I_4$ and $I_5$, as well). It is generally desirable to choose $I_1$ and $I_2$ (and $I_4$ and $I_5$, as well) as small as possible so that Q1 and Q2; Q7 and Q8; Q9 and Q10 or their field effect transistor surrogates need carry as little current as possible. This tends to reduce the size requirement of these devices, and in the FIGS. 1, 2 and 3 configurations reduces the quiescent currents that must flow in the input circuitry supplying the voltage-to-current converter. At the same time $I_3$ can be made larger than $I_1+I_2$ by a factor, which factor is almost as large as the current gains $\beta_3$ and $\beta_4$, permitting the reduction of $(R_1+R_2)$ one wishes in order to get higher-valued voltage-to-current conversion factors.

Figure 4:
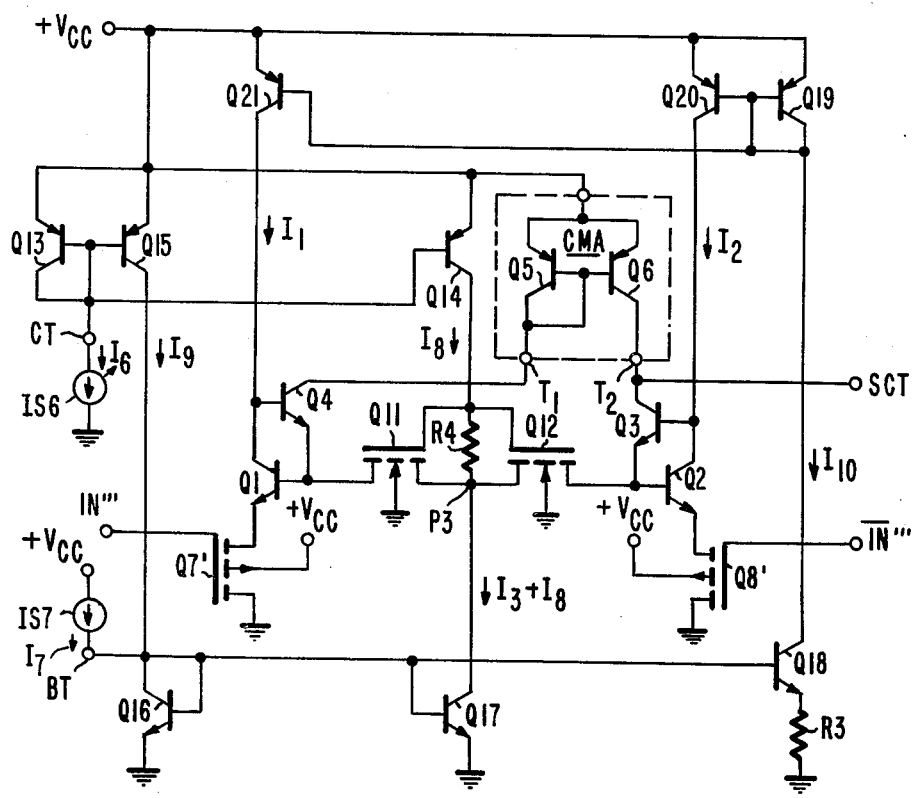
FIG. 4 is a schematic diagram of a voltage-to-current converter embodying the present invention, the conversion ratio of which converter is electrically alterable.

In FIG. 4 fixed-resistance resistive elements R1 and R2 are replaced by the channels of n-channel field effect transistors Q11 and Q12 in a voltage-to-converter apparatus basically similar to that shown in FIG. 2, this being done so that the voltage-to-current conversion ratio may be electrically altered. Emitter-follower transistors Q7 and Q8 are replaced by p-channel field effect transistors Q7' and Q8' to secure higher input impedance at the teminals IN'" and $\overline{\text{IN}}$'" receiving the input voltage to be converted to output current. An adjustable current supply IS6 is connected to withdraw a control current $I_6$ from a control terminal CT at the input connection of a dual-output current mirror amplifier configuration shown as comprising PNP transistors Q13, Q14, Q15. A current supply IS7 is connected to supply a bias current $I_7$ to bias terminal BT at the input connection of a dual-output current amplifier comprising NPN transistors Q16 and Q17, arranged as master and slave transistors in a current mirror amplifier relationship, as well as a NPN transistor Q18 and its emitter degeneration resistor R3.

Responsive to $I_6$, the current mirror amplifier configuration comprising Q13, Q14, Q15 supplies currents $I_8$ and $I_9$ proportional to $I_6$. $I_8$ flows through resistive element R4 to cause, in accordance with Ohm's Law, a potential drop proportional to $I_8$—and thus to $I_6$—which drop establishes the source-to-gate voltages of Q11 and Q12 used to control their respective channel resistances. $I_9$ is summed with $I_7$ at the input of the current amplifier comprising Q16, Q17, Q18 and R3. The current gain of the current mirror amplifier relationship between Q16 and Q17 may be chosen such that a current component equal to $I_8$ is withdrawn from node P3 responsive to $I_9$; $I_3$ will flow responsive to $I_9$ in same ratio as $I_8$ to $I_9$.

As $I_6$ and thus $I_8$ is increased in value, the potential drop across R4 will increase to bias Q11 and Q12 into greater conduction, decreasing their respective channel resistances and so increasing the voltage-to-current conversion factor as between voltage input terminals IN'" and $\overline{\text{IN}}$'" on one hand, and current output terminal SCT on the other. Conversely, as $I_6$ and thus $I_8$ is decreased, the voltage-to-current conversion factor will be decreased towards zero.

Q18 demands a collector current $I_{10}$ responsive to $I_7+I_9$ which, because of emitter degeneration resistor R3, tends to be logarithmically related to $I_7+I_9$ and thus less responsive to variation of $I_9$ than the $I_3+I_8$ collector current of Q17. $I_{10}$ also tends to be relatively small, owing to the current feedback afforded by R3. This suits $I_{10}$ for use as input current to a dual-output current mirror amplifier comprising PNP transistors Q19, Q20 and Q21 and supplying output currents $I_1$ and $I_2$ responsive to $I_{10}$.

The common-mode rejection capability of the VIC configuration in combination with a current mirror amplifier CMA keeps response to the variations in $I_1$ and $I_2$ from appearing at output terminal SCT so long as those variations track each other, as they do in FIG. 4. This common-mode rejection capability also allows one to dispense with Q15 for supplying $I_9$, so long as $I_3$ is signal terminal IN'', having an output electrode connected to receive operating potential, and having a common electrode connected to said terminal IN; and a fourth current supply for supplying at said terminal IN a current of amplitude larger than that supplied by said first current supply and of opposite polarity—and wherein said second voltage follower transistor amplifier includes:

a still further transistor of said first conductivity type having an input electrode at an auxiliary input signal terminal $\overline{IN}''$, having an output electrode connected to receive operating potential, and having a common electrode connected to said terminal $\overline{IN}$; and a fifth current supply for supplying at terminal $\overline{IN}$ a current of amplitude larger than that supplied by said second current supply and of opposite polarity.

8. A voltage-to-current converter comprising:

first and second terminals for receiving an operating potential therebetween;

terminals IN and $\overline{IN}$ for receiving therebetween the voltage to be converted to a current;

first and second transistors of a first conductivity type having respective input electrodes, having respective output electrodes, and having respective common electrodes respectively connected to said IN terminal and to said $\overline{IN}$ terminal;

electrically controlled resistance means connected between the input electrodes of said first and said second transistors;

first and second current supply means respectively connected to the output electrode of said first transistor and to the output electrode of said second transistor for supplying collector currents to said first and second transistors respectively;

first feedback means providing direct coupled feedback between the output and input electrodes of said first transistor, including a third transistor of said first conductivity type having an input electrode to which the output electrode of said first transistor connects, having an output electrode, and having a common electrode connected to the input electrode of said first transistor;

second feedback means providing direct coupled feedback between the output and input electrodes of said second transistor, including a fourth transistor of said first conductivity type having an input electrode to which the output electrode of said second transistor connects, having an output electrode, and having a common electrode connected to the input electrode of said second transistor;

means for applying forward biasing currents to the common electrodes of said third and fourth transistors;

means for subtractively combining currents flowing through the output electrodes of said third and fourth transistors so that their opposite-polarity signal components combine to augment each other and their like-polarity direct components combine to reduce each other, thereby to produce an output current;

fifth and sixth transistors of like conductivity type, each being a field effect transistor, each having respective source and drain electrodes with a respective channel therebetween, and each having a respective gate electrode;

means serially connecting the channels of said fifth and sixth transistors between the input electrodes of said first and second transistors to provide said electrically controlled resistance means, said means serially connecting them being of a type where the electrodes at the interconnected ends of the respective channels of said fifth and sixth transistors are similar electrodes;

resistive means connecting the gate electrodes of said fifth and sixth transistors to their respective source electrodes;

adjustable, first current supplying means connecting said first terminal to the gate electrodes of said fifth and sixth transistors for controlling the potential drop appearing across said resistive means and thus the resistance exhibited by the channels of said fifth and sixth transistors; and second current supplying means connecting said second terminal to the source electrodes of said fifth and sixth transistors for causing currents to flow through the source electrodes of said fifth and sixth transistors and through the common electrodes of said third and fourth transistors.

9. A voltage-to-current converter as set forth in claim 8 wherein the interconnected ends of the respective channels of said fifth and sixth transistors are their source electrodes, wherein said resistive means essentially consists of a single resistance having a first end at an interconnection of the gate electrodes of said fifth and sixth transistors and having a second end at the interconnection of their source electrodes, wherein said first current supplying means applies at a single adjustable-value current to the interconnected gate electrodes of said fifth and sixth transistors, and wherein said second current supplying means applies a single current larger than the expected maximum value of said adjustable-value current to the interconnected source electrodes of said fifth and sixth transistors.

* * * * *

UNITED STATES PATENT AND TRADEMARK OFFICE
CERTIFICATE OF CORRECTION

PATENT NO. : 4,216,435

DATED : August 5, 1980

INVENTOR(S) : Adel Abdel Aziz Ahmed

It is certified that error appears in the above-identified patent and that said Letters Patent is hereby corrected as shown below:

col. 3, last line, after "$\beta_{Q4}$" (second occurrence), insert --+--.

Signed and Sealed this

Eleventh Day of November 1980

[SEAL]

Attest:

SIDNEY A. DIAMOND

Attesting Officer

Commissioner of Patents and Trademarks